US 9,190,437 B2

(12) United States Patent
Kawanabe et al.

(10) Patent No.: US 9,190,437 B2
(45) Date of Patent: Nov. 17, 2015

(54) SEMICONDUCTOR DETECTION APPARATUS CAPABLE OF SWITCHING CAPACITANCE AMONG DIFFERENT LEVELS, AND DETECTION SYSTEM INCLUDING THE APPARATUS

(75) Inventors: Jun Kawanabe, Kodama-gun (JP); Chiori Mochizuki, Sagamihara (JP); Minoru Watanabe, Honjo (JP); Masato Ofuji, Honjo (JP); Keigo Yokoyama, Honjo (JP); Kentaro Fujiyoshi, Kumagaya (JP); Hiroshi Wayama, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 285 days.

(21) Appl. No.: 13/610,472

(22) Filed: Sep. 11, 2012

(65) Prior Publication Data

US 2013/0099093 A1 Apr. 25, 2013

(30) Foreign Application Priority Data

Oct. 20, 2011 (JP) .................................. 2011-230908

(51) Int. Cl.
*H01J 40/14* (2006.01)
*H01L 27/146* (2006.01)

(52) U.S. Cl.
CPC .... *H01L 27/14609* (2013.01); *H01L 27/14665* (2013.01)

(58) Field of Classification Search
CPC .................... H01L 27/14665; H01L 27/14069
USPC .......................................... 250/214 R, 214.1
See application file for complete search history.

(56) References Cited

U.S. PATENT DOCUMENTS

2002/0190215 A1 12/2002 Tashiro et al.

FOREIGN PATENT DOCUMENTS

| CN | 1764244 A | 4/2006 |
|---|---|---|
| JP | S58-134458 A | 8/1983 |
| JP | S63-044759 A | 2/1988 |
| JP | H01-119049 A | 5/1989 |
| JP | 2000-138346 A | 5/2000 |
| JP | 2001-320039 A | 11/2001 |
| JP | 2002-344809 A | 11/2002 |
| JP | 2002-350551 | * 12/2002 |
| JP | 2003-005672 A | 1/2003 |
| JP | 2008085029 A | 4/2008 |

* cited by examiner

*Primary Examiner* — Thanh Luu
(74) *Attorney, Agent, or Firm* — Canon USA Inc., IP Division

(57) ABSTRACT

A detection apparatus includes a transistor disposed on a substrate, a conversion element disposed above the transistor and connected to the transistor, a capacitor connected in parallel with conversion element to the transistor, the capacitor including, between the substrate and the conversion element, an ohmic contact part connected to the conversion element, a semiconductor part connected to the ohmic contact part, and an electrically conductive part disposed at a location opposite to the semiconductor part and the ohmic contact part via an insulating layer, and a potential supplying unit configured to selectively supply a first electric potential to the electrically conductive part to accumulate charge carriers in the semiconductor part and a second electric potential to the electrically conductive part to deplete the semiconductor part. The detection apparatus configured in the above-described manner is capable of controlling pixel capacitance thereby achieving a high signal-to-noise ratio.

23 Claims, 10 Drawing Sheets

SEMICONDUCTOR DETECTION APPARATUS CAPABLE OF SWITCHING CAPACITANCE AMONG DIFFERENT LEVELS, AND DETECTION SYSTEM INCLUDING THE APPARATUS

BACKGROUND OF THE INVENTION

1. Field of the Invention

The present invention relates to a medical diagnostic imaging apparatus, a non-destructive testing apparatus, and a detection apparatus and a detection system for use in an analysis apparatus using radiation or the like.

2. Description of the Related Art

Thin-film semiconductor technology has been used to produce sensing and imaging devices, such as a photosensor apparatus or a radiation detection apparatus using an array of pixels. In this type of apparatuses, each pixel includes a combination of a switch element such as a TFT (thin film transistor) and a conversion element such as a photoelectric conversion element. Particularly, in recent years, to meet a requirement for higher sensitivity and higher operating speed, an effort has been made to achieve the requirement by producing a pixel array of a detection apparatus by using polycrystalline semiconductor TFTs as switching elements. In general, the pixel structure used in a detection apparatus can be classified into two types, i.e., a single-plane type in which a conversion element and a switch element are disposed in the same plane and a stacked type in which a conversion element is disposed above (stacked upon) a switch element. In the production of single-plane type pixels, the conversion element and the switch element can be produced using the same semiconductor production process, which allows simplification of the production process. On the other hand, in the production of stacked-type pixels, the provision of the conversion element above the switch element makes it possible to increase the size of the conversion element in each pixel compared with the single-plane type, and thus an increased aperture ratio can be obtained. The aperture ratio is generally understood as the ratio between the transparent area of a pixel (excluding the pixel's wiring area) and the whole pixel area. In the single-plane type, the area occupied by the switch element and wiring reduces the aperture ratio. In contrast, in the stacked type, because the switch element is stacked with the conversion element and because microfabrication enables reduction in the size of the wiring, the aspect ratio is increased. Therefore, in a stacked-type detection apparatus, it is possible to increase optical efficiency (the amount of radiation or light incident on the active area of the pixel) compared with the single-plane type detection apparatus. This makes it possible to provide a detection apparatus with a high signal-to-noise (S/N) ratio and high optical sensitivity.

Regarding such a detection apparatus, Japanese Patent Application Laid-Open No. 2008-085029 discloses a photoelectric conversion apparatus, using a pixel including a photoelectric conversion element disposed above a switch element on a substrate, configured such that capacitance of the pixel is increased to increase the light intensity (the amount of radiation) acceptable by the pixel. More specifically, in the photoelectric conversion apparatus disclosed in Japanese Patent Application Laid-Open No. 2008-085029, a capacitor is directly connected to a photoelectric conversion element and the capacitor is disposed in a region where the capacitor overlaps the photoelectric conversion element when seen in plan view. In the above-described apparatus disclosed in Japanese Patent Application Laid-Open No. 2008-085029, because the capacitor is directly connected to the photoelectric conversion element, the pixel has a fixed capacitance value which cannot be adjusted.

In a detection apparatus used to take a radiographic image for medical diagnosis, there is a need for a detection apparatus capable of capturing both still images and moving images. In capturing radiographic images, the amount of radiation used in taking one moving image is about $1/100$ of that used in capturing one still image. Therefore, there is a large difference in the maximum amount of radiation acceptable by the pixel between moving and still images. For example, if a moving image is captured using a pixel with large capacitance set to be optimum for detecting high radiation density in capturing still images, the capacitance of the pixel may be too large in capturing moving images, and thus there is a possibility that a resultant signal is not sufficiently high. On the other hand, in a case where a still image is captured using a pixel with small capacitance set to be optimum for detecting low radiation density in capturing moving images, the capacitance of the pixel may be too small for capturing still images, and thus there is a possibility that saturation occurs in the pixel, and a resultant signal does not include necessary image information.

U.S. Patent Application Publication No. 2002/0190215 discloses a detection apparatus configured such that a capacitor is connected to a conversion element via a switch to achieve a capability of controlling the capacitance of the conversion element by controlling the switch.

SUMMARY OF THE INVENTION

In view of the above, at least one of the embodiments described herein discloses a detection apparatus capable of dynamically adjusting the capacitance of a pixel and capable of providing a high signal-to-noise ratio regardless of the type of image being taken.

According to at least on exemplary embodiment, a detection apparatus includes a transistor disposed on a substrate, a conversion element disposed above the transistor and connected to the transistor, a capacitor connected in parallel with the conversion element to the transistor, the capacitor including, between the substrate and the conversion element, an ohmic contact part connected to the conversion element, a semiconductor part connected to the ohmic contact part, and an electrically conductive part disposed at a location opposite to the semiconductor part and the ohmic contact part via an insulating layer, and a potential supplying unit configured to selectively supply a first electric potential to the electrically conductive part to accumulate charge carriers in the semiconductor part and a second electric potential to the electrically conductive part to deplete the semiconductor part.

Further features and advantages will become apparent from the following description of the various exemplary embodiments with reference to the attached drawings.

DESCRIPTION OF THE EMBODIMENTS

Embodiments of the present invention are described below with reference to the accompanying drawings. In the present description, the term "radiation" generally refers to electromagnetic radiation in the visible and non-visible ranges of the spectrum, but radiation is also used to describe particle beams such as an alpha ray, a beta ray, a gamma ray, etc. radiated via radioactive decay, and other beams with high energy similar to that of such particle beams. For example, as describe herein, the term "radiation" may include a visible-light ray, an ultra violet (UV) and extreme UV ray, an X-ray, a cosmic ray, etc., which fall within the scope of radiation.

Figure 1A:
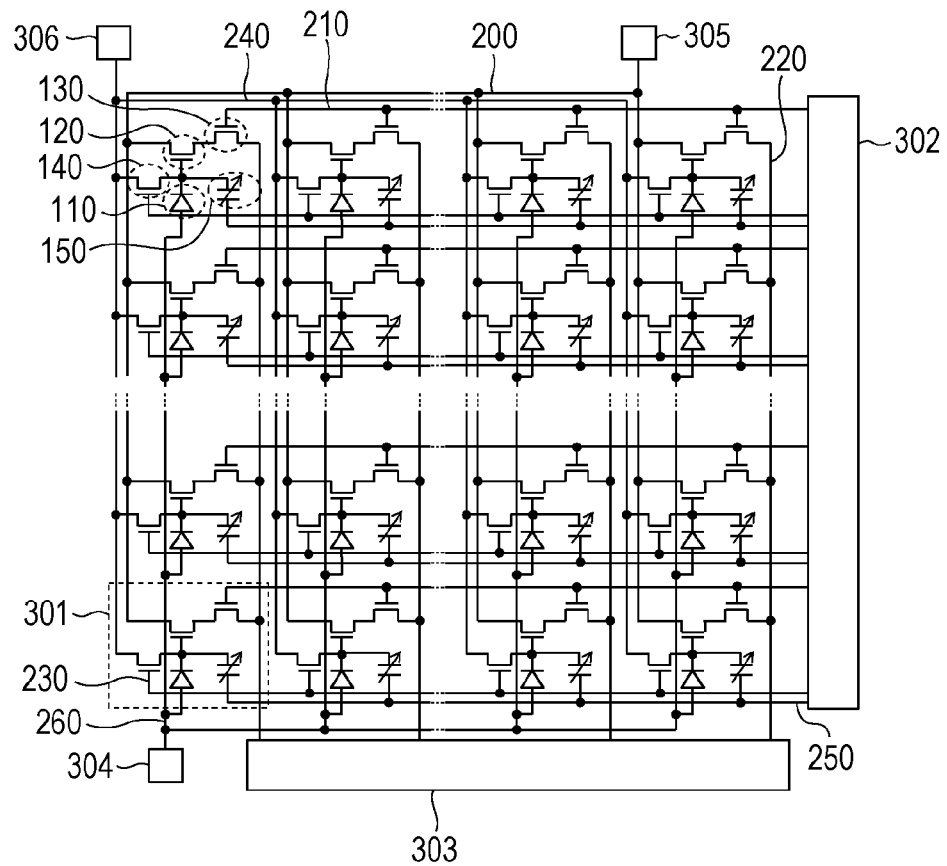
FIG. 1A is an equivalent circuit diagram of a whole detection apparatus according to a first embodiment.
Figure 1B:
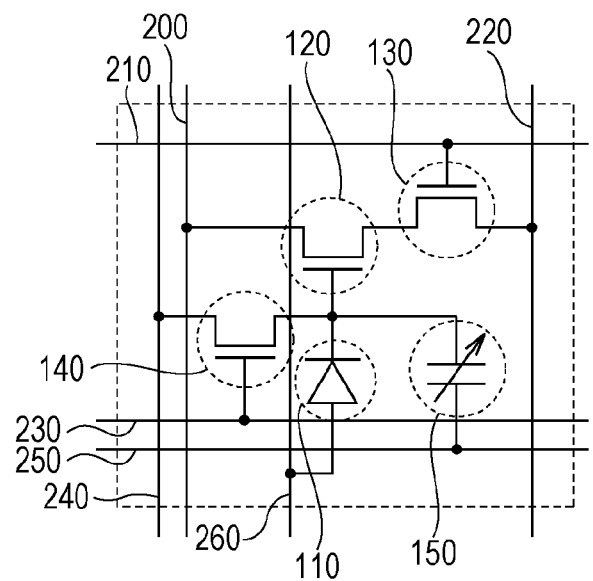
FIG. 1B is an equivalent circuit diagram of one pixel of the detection apparatus.

First, referring to FIG. 1A and FIG. 1B, a detection apparatus according to a first exemplary embodiment is described. FIG. 1A is an equivalent circuit diagram of a whole detection apparatus according to the present embodiment, and FIG. 1B is a cross-sectional view of one pixel of the detection apparatus.

The detection apparatus according to the present embodiment includes an insulating substrate such as a glass substrate and a pixel array which is formed on the substrate such that the pixel array includes a plurality of pixels 301 arranged in row and column directions in the pixel array. Each pixel 301 includes a conversion element 110, a first TFT 120, a second TFT 130, a third TFT 140, and a capacitor 150. The conversion element 110 includes two electrodes, i.e., a first electrode electrically isolated between pixels, and a second electrode connected together among pixels. The first electrode of the conversion element 110 is connected to a gate of the first TFT 120, and the second electrode of the conversion element 110 is connected to a bias power supply 304. In the present embodiment, a PIN-type photodiode is used as each conversion element 110 configured to convert radiation or light into an electric charge, and the bias power supply 304 supplies an electric potential Vs to the second electrode via an electrode wiring 260 such that the photodiode is reversely biased. The first TFT 120 functions as an amplifying transistor for amplifying the electric charge generated in the conversion element and outputting a result. The second TFT 130 is for selecting the pixel. The third TFT 140 is for resetting an electric potential of a connection node between the conversion element 110 and the gate of the first TFT 120 to electric potential Vss. Gates of second TFTs 130 arranged in the row direction are connected in common to a selection driving line 210 which is connected to a driving circuit 302. One of a source and a drain of each of second TFTs 130 arranged in the column direction is connected in common to a signal line 220 which is connected to a readout circuit 303. Gates of third TFTs 140 arranged in the row direction are connected in common to a reset driving line 230 which is connected to a driving circuit 302. The driving circuit 302 controls a pixel selection operation and a pixel reset operation by supplying a turn-on voltage to the second TFT 130 via the selection driving line 210 and supplying a turn-on voltage to the third TFT 140 via the reset driving line 230 while controlling the timing of supplying the respective turn-on voltages. One of the source and the drain of each first TFT 120 is supplied with an electric potential Vdd from a first power supply circuit 305 via a first power supply line 200. One of the source and the drain of each third TFT 140 is supplied with an electric potential Vss from a second power supply circuit 306 via a second power supply line 240. In a case where the electric potential Vdd is equal to the electric potential Vss, the power supplies and the power supply lines may share a single power supply and a single power supply line for use in common. One electrode of the capacitor 150 is connected to a first electrode of the conversion element 110, and the capacitor 150 is connected in parallel with the conversion element 110 to the first TFT 120. The other electrode of each of capacitors 150 arranged in the row direction is connected to a capacitor line 250 which is connected to the driving circuit 302. In the present embodiment, a combination of the capacitor line 250 and the driving circuit 302 functions as a potential supplying unit. Note that the capacitor 150 is of a variable capacitance type whereby it is possible to change the capacitance value of the pixel depending on an image capture mode. For example, in a transmissive image capture mode for medical diagnosis, the radiation intensity used in capturing one image is low compared in a reflective image (still image) capture mode, and thus it is allowed for the pixel to have a smaller saturation charge than in the reflective image capture mode. Therefore, in the transmissive image capture mode, it is allowed to reduce the saturation charge by reducing the capacitance value of the pixel to a level lower than in the reflective image capture mode thereby achieving higher sensitivity. On the other hand, in the reflective image capture mode, the radiation intensity is greater in capturing one image than in the transmissive image capture mode, and thus the saturation charge of the pixel needs to be greater than in the transmissive image capture mode. Therefore, in the reflective image capture mode, the capacitance value of the pixel is set to be greater than in the transmissive image capture mode. In the example described above, it is assumed by way of example that the PIN-type photodiode is used as the conversion element. However, the conversion element is not limited to the PIN-type photodiode, and other types of conversion elements such as a MIS-type photoelectric conversion element may be used as long as the conversion elements are capable of converting light into an electric charge. In a case where the conversion element needs to convert a radiation into an electric charge, the conversion element may be realized by a combination of a photoelectric conversion element and a scintillator disposed above the photoelectric conversion element such that the scintillator converts a radiation into visible light and the photoelectric conversion element in turn converts the visible light into an electric charge. Alternatively, in this case, an element capable of directly converting a radiation into an electric charge without using a scintillator may be used as the conversion element. Such an element capable of directly converting a radiation into an electric charge may be realized, for example, by employing a structure in which a semiconductor material such as selenium is disposed between two electrodes.

Figure 2A:
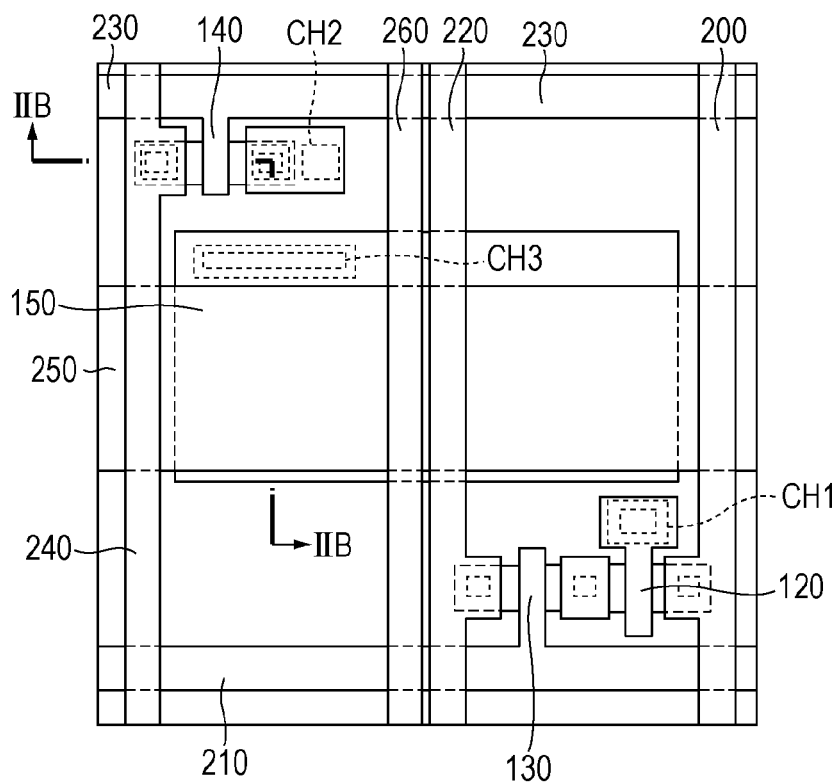
FIG. 2A is a plan view of one pixel of the detection apparatus according to the first embodiment.
Figure 2B:
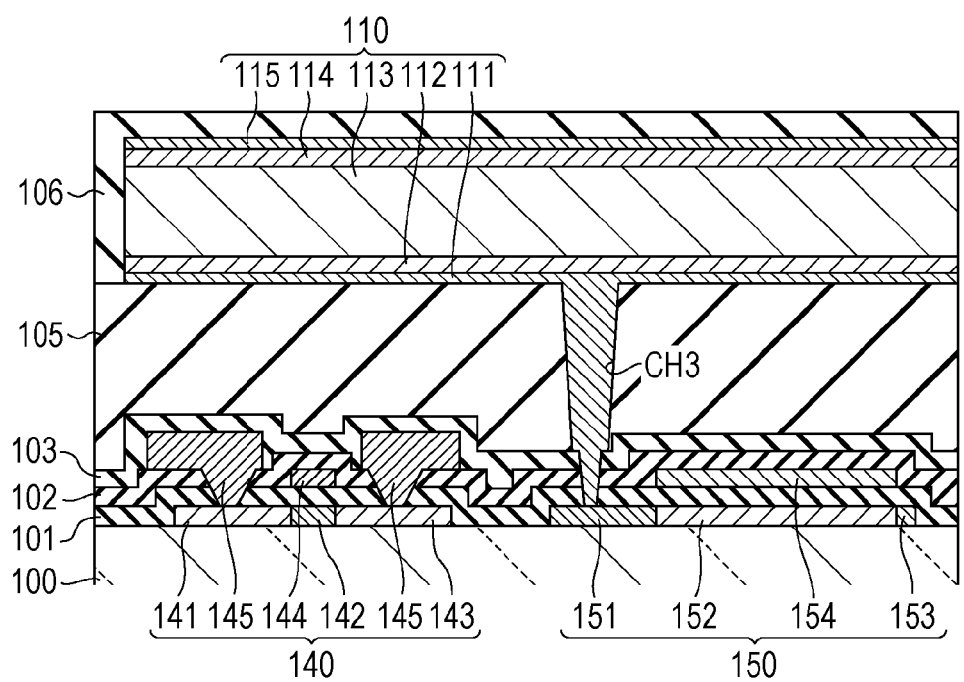
FIG. 2B is a cross-sectional view of the one pixel of the detection apparatus.

Next, referring to FIG. 2A and FIG. 2B, a structure of one pixel of the detection apparatus according to the first embodiment is described below. FIG. 2A is a plan view of one pixel, and FIG. 2B is a cross-sectional view taken along line IIB-IIB of FIG. 2A. Note that, for simplicity of illustration, FIG. 2A shows only constituent elements located at lower levels than a first electrode 111 of the conversion element 110.

As shown in FIG. 2A, the gate electrode of the first TFT 120 is connected to the first electrode 111 of the conversion element 110 via a contact hole CH 1. The other one of the source and the drain of the third TFT 140 is connected to the first electrode 111 of the conversion element 110 via a contact hole CH 2. One of the electrodes of the capacitor 150 is connected to the first electrode 111 of the conversion element 110 via a contact hole CH 3. To obtain large capacitance for the capacitor 150, as large an area as possible may be assigned in layout to the capacitor 150. The first TFT 120, the second TFT 130, the third TFT 140, and the capacitor 150 are disposed between the conversion element 110 and the insulating substrate 100. Wirings other than the electrode wiring 260 are also disposed between the conversion element 110 and the insulating substrate 100.

As shown in FIG. 2B, the conversion element 110 includes the first electrode 111, a first-conductivity-type impurity semiconductor layer 112, a semiconductor layer 113, a second-conductivity-type impurity semiconductor layer 114, and a second electrode 115, which are disposed vertically in the above-described order as seen in an upward direction from the substrate 100. In the present embodiment, the first-conductivity-type impurity semiconductor layer 112 is formed using n-type amorphous silicon, and the second-conductivity-type impurity semiconductor layer 114 is formed using p-type amorphous silicon. A third insulating layer 103 and an interlayer insulating layer 105 are disposed between the conversion element 110 and each transistor. Furthermore, a second insulating layer 102, a third insulating layer 103, and an interlayer insulating layer 105 are disposed between the conversion element 110 and the capacitor 150.

The third TFT 140 includes a semiconductor layer, a first insulating layer 101, a gate 144, a second insulating layer 102, and an electrode 145, which are disposed vertically in the above-described order as seen in the upward direction from the substrate 100. The semiconductor layer of the third TFT 140 includes a semiconductor region 142, an impurity semiconductor region 141 with a higher impurity concentration than the semiconductor region 142, and an impurity semiconductor region 143 with a higher impurity concentration than the semiconductor region 142. The semiconductor region 142 is formed at a location corresponding to orthogonal projection of the gate 144. The impurity semiconductor region 141 and the impurity semiconductor region 143 are doped with impurity of the same conductivity type, one of which functions as a source and the other as a drain. In the present embodiment, the semiconductor layer of the third TFT 140 is formed using a polycrystalline semiconductor material such as polycrystalline silicon. The gate 144 is electrically connected to the reset driving line 230. The impurity semiconductor region 141 is connected to a reset line 240 via the electrode 145. The impurity semiconductor region 143 is connected to the first electrode 111 of the conversion element 110 via the electrode 145 and the contact hole CH 2. Although not shown in the figures, the first TFT 120, the second TFT 130, and the third TFT 140 include layers prepared in the same processing steps and they have similar layer structures.

The capacitor 150 includes a semiconductor layer functioning as one of electrodes, a first insulating layer 101, and a conductive layer 154 functioning as the other one of the electrodes, which are disposed vertically in the above-described order as seen in the upward direction from the substrate 100. The semiconductor layer of the capacitor 150 includes an impurity semiconductor region 151, a semiconductor region 152, and an impurity semiconductor region 153. The impurity semiconductor region 151 and the impurity semiconductor region 153 are doped with impurity of the same conductivity type. Note that the impurity semiconductor region 153 is not necessarily needed in the present embodiment. The semiconductor region 152 functions as a semiconductor part essential to the embodiment. In the present embodiment, the semiconductor region 152 is located in a region corresponding to orthogonal projection of the conductive layer 154. The impurity semiconductor region 151 functions as an ohmic contact part according to the present embodiment and is connected to the first electrode 111 of the conversion element 110 via the contact hole CH 3. The ohmic contact part is for providing an ohmic connection between the first electrode 111 and the semiconductor region 152. The conductive layer 154 is connected to the capacitor line 250. The capacitor line 250 is connected to the driving circuit 302 so as to receive at least a first electric potential and a second electric potential from the driving circuit 302, and thus the capacitor line 250 functions as an electrically conductive part according to the present embodiment. This electrically conductive part is disposed so as to oppose the semiconductor part and the ohmic contact part via the first insulating layer 101. For example, in a case where the impurity semiconductor region 151 is doped with $n^+$ impurity, when a particular positive electric potential is supplied to the conductive layer 154, electrons are induced at an interface, on a side of the conductive layer 154, of the semiconductor region 152, i.e., accumulation of charge carriers occurs at the interface. When carriers that carry electric charge in the semiconductor are accumulated in the semiconductor region 152, the semiconductor region 152 functions as an electrically conductive region which functions as one of electrodes of the capacitor 150. As a result, the capacitance value of the capacitor 150 is determined by an overlapping area between the semiconductor region 152 and the conductive layer 154 and a dielectric constant of the first insulating layer 101. In the present embodiment, the first electric potential is set such that the application of the first electric potential to the conductive layer 154 causes the semiconductor layer of the capacitor 150 to function as the electrode. On the other hand, when a ground potential or a particular negative electric potential is supplied to the conductive layer 154, the semiconductor region 152 is depleted. The depletion of the semiconductor region 152 results in an increase in specific resistance of the semiconductor region 152 and thus the semiconductor region 152 functions as an insulating regions, i.e., in this case, the semiconductor region 152 does not function as one electrode of the capacitor 150. Therefore, in this case, the capacitance value of the capacitor 150 is given capacitance produced by capacitive coupling between the impurity semiconductor region 151 and the conductive layer 154 and thus the capacitance is negligibly small compared with the capacitance value of the conversion element 110. In the present embodiment, the second electric potential is set such that the application of the second electric potential to the conductive layer 154 causes the semiconductor layer of the capacitor 150 not to functions as the electrode. By selectively applying the first electric potential or the second electric potential to the conductive layer 154 by the potential supplying unit realized by the combination of the driving circuit 302 and the capacitor line 250 in the above-described manner, it becomes possible to control the capacitance value of the capacitor 150 connected to the conversion element 110. That is, when the first electric potential is supplied to the conductive layer 154, the capacitance value of the capacitor 150 is added to the conversion element 110, while when the second electric potential is supplied to the conductive layer 154, the capacitance value of the capacitor 150 is not added to the conversion element 110. Note that the first insulating layer 101 may be formed using an insulating film with a high dielectric constant such as a TEOS (tetraethyl orthosilicate) film, a silicon oxide film, or the like. The thickness of the first insulating layer 101 may be set in a range from 50 to 200 nm such that the capacitor 150 has a proper capacitance value. Furthermore, in the present embodiment, the semiconductor layer of the capacitor 150 may be formed using a polycrystalline semiconductor material such as polycrystalline/amorphous silicon. The capacitor 150 includes layers that are formed by the same processing steps as layers of the third TFT 140 or the like and the capacitor 150 has a layer structure similar to that of the third TFT 140 or the like. More specifically, for example, the semiconductor layer of the capacitor 150 is formed via the same processing steps as the semiconductor layer of the third TFT, and the conductive layer 154 is formed via the same processing steps as the gate 144.

Figure 3A:
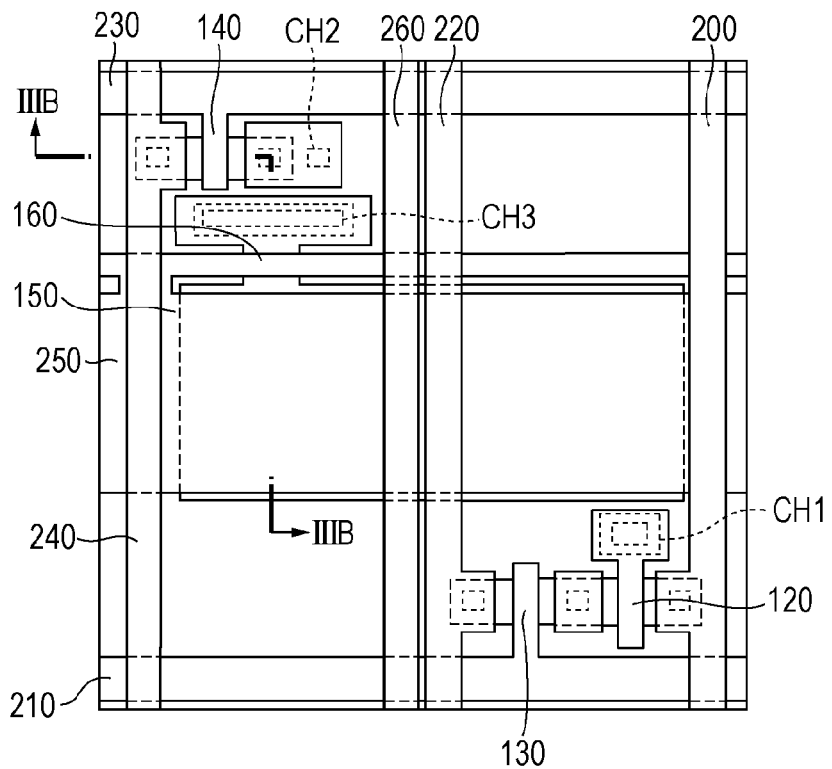
FIG. 3A is a plan view illustrating another example of a structure of one pixel of a detection apparatus according to the first embodiment, and FIG. 3B a cross-sectional view of the one pixel of the detection apparatus.
Figure 3B:
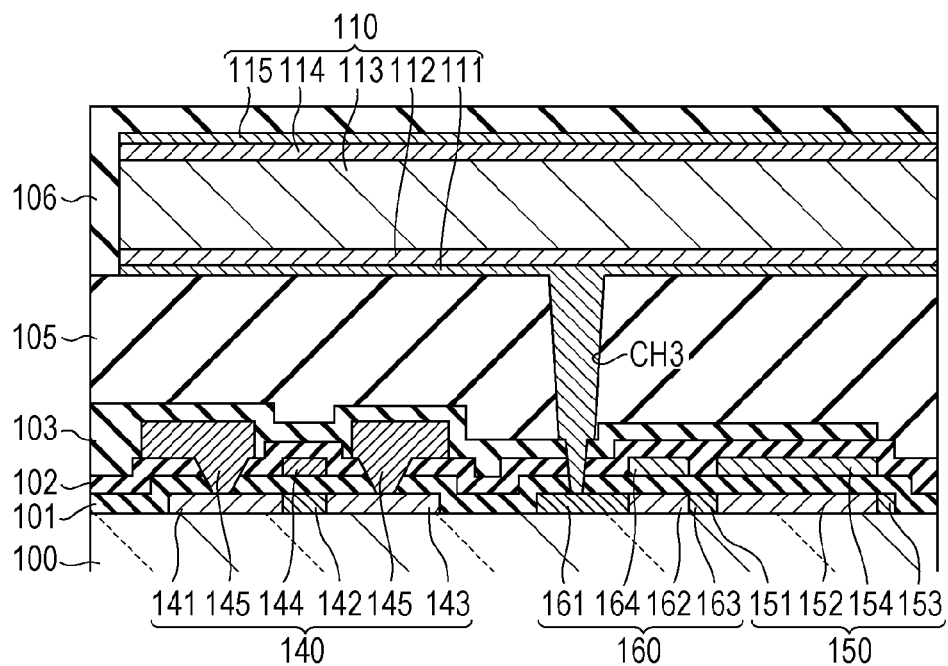

Next, referring to FIG. 3A and FIG. 3B, another example of a structure of one pixel of the detection apparatus according to the first embodiment of the invention is described. In FIG. 3A and FIG. 3B, elements similar to those described above with reference to FIG. 2A or FIG. 2B are denoted by similar reference numerals or symbols, and a further description thereof is omitted.

The present example shown in FIG. 3A and FIG. 3B are different from the previous example shown in FIG. 2A and FIG. 2B in the following points. That is, in the present example, a fourth TFT 160 is disposed between the conversion element 110 and the capacitor 150 such that the fourth TFT 160 controls the connection between the conversion element 110 and the capacitor 150. The fourth TFT 160 includes a semiconductor layer, a first insulating layer 101, and a gate 164, which are disposed vertically in this order as seen in an upward direction from the substrate 100. The semiconductor layer of the fourth TFT 160 includes a semiconductor region 162, an impurity semiconductor region 161 with a higher impurity concentration than the semiconductor region 162, and an impurity semiconductor region 163 with a higher impurity concentration than the semiconductor region 162. The semiconductor region 162 is formed in a semiconductor layer at a location corresponding to an orthogonal projection of the gate 164. The impurity semiconductor region 161 and the impurity semiconductor region 163 are doped with impurity of the same conductivity type. One of these regions functions as a source and the other as a drain. In the present embodiment, the semiconductor layer of the fourth TFT 160 is formed using a polycrystalline semiconductor material such as polycrystalline/amorphous silicon. The gate 144 is connected to the capacitor line 250. The capacitor line 250 is connected to the driving circuit 302 so as to receive at least a first electric potential and a second electric potential from the driving circuit 302. The impurity semiconductor region 161 is connected to the first electrode 111 of the conversion element 110 via a contact hole CH 3. The impurity semiconductor region 163 is connected to the impurity semiconductor region 151 of the capacitor 150. The fourth TFT 160 includes layers that are formed by the same processing steps as the layers of the third TFT 140 or the like and the fourth TFT 160 has a layer structure similar to that of the third TFT 140 or the like. In the present example, the impurity semiconductor region 163 and the impurity semiconductor region 151 of the capacitor 150 are formed so as to share the same region.

In the capacitor 150, when the first electric potential is supplied to the conductive layer 154, the semiconductor region 152 of polycrystalline semiconductor functions as an electrode, while when the second electric potential is supplied to the conductive layer 154, the semiconductor region 152 of polycrystalline semiconductor does not function as the electrode. However, if the capacitor 150 is formed so as to have a large area to achieve a large capacitance value, the result is an increase in probability that there is a crystal grain boundary in the semiconductor region 152, which results in an increase in probability that the semiconductor region 152 includes an electrically conductive path formed by the crystal grain boundary. Therefore, in a case where the capacitor 150 of a pixel includes a crystal grain boundary, there is a possibility that the semiconductor region 152 functions as the electrode even in a state in which the second electric potential is supplied to the conductive layer 154. In the present example, to avoid the above problem, the fourth TFT 160 is disposed between the conversion element 110 and the capacitor 150. The gate of the fourth TFT 160 is connected to the capacitor line 250 such that the first electric potential or the second electric potential is selectively supplied thereto. When the first electric potential is supplied to the gate of the fourth TFT 160, the fourth TFT 160 turn on, while the fourth TFT 160 turns off when the second electric potential is supplied to the gate. Thus, when the second electric potential is supplied to the conductive layer 154 of the capacitor 150, the electric connection to the conversion element 110 is cut off thereby achieving high-reliability capacitance modulation.

In the present embodiment described above, it is assumed by way of example that the potential supplying unit is realized by the combination of the capacitor line 250 and the driving circuit 302. However, the potential supplying unit is not limited to that. For example, the driving circuit 302 may be replaced with a power supply circuit capable of selectively supplying the first electric potential and the second electric potential.

Furthermore, in the present embodiment described above, it is assumed by way of example that each pixel includes an active pixel sensor including the first to third thin film transistors. However, the pixel structure is not limited to that. For example, one of a source and a drain of a thin film transistor may be connected to a conversion element and the other one may be connected to a signal line.

Furthermore, in the present embodiment described above, it is assumed by way of example that an upper-gate-type thin film transistor formed using polycrystalline semiconductor is employed as each thin film transistor. However, the structure of the thin film transistor is not limited to that. For example, an inversely-staggered-type thin film transistor formed using amorphous semiconductor such as amorphous silicon may be employed. In this case, each impurity semiconductor region serving as a corresponding ohmic contact part may be replaced with a proper impurity semiconductor layer.

Next, a second exemplary embodiment is described. In the second embodiment, the capacitor is configured to have a greater capacitance value than in the first embodiment. When a second electric potential is applied to the capacitor, an electrode of the capacitor is connected to a fixed potential. In the following description, similar elements to those according to the first embodiment are denoted by similar reference numerals or symbols, and a further explanation thereof is omitted.

Figure 4A:
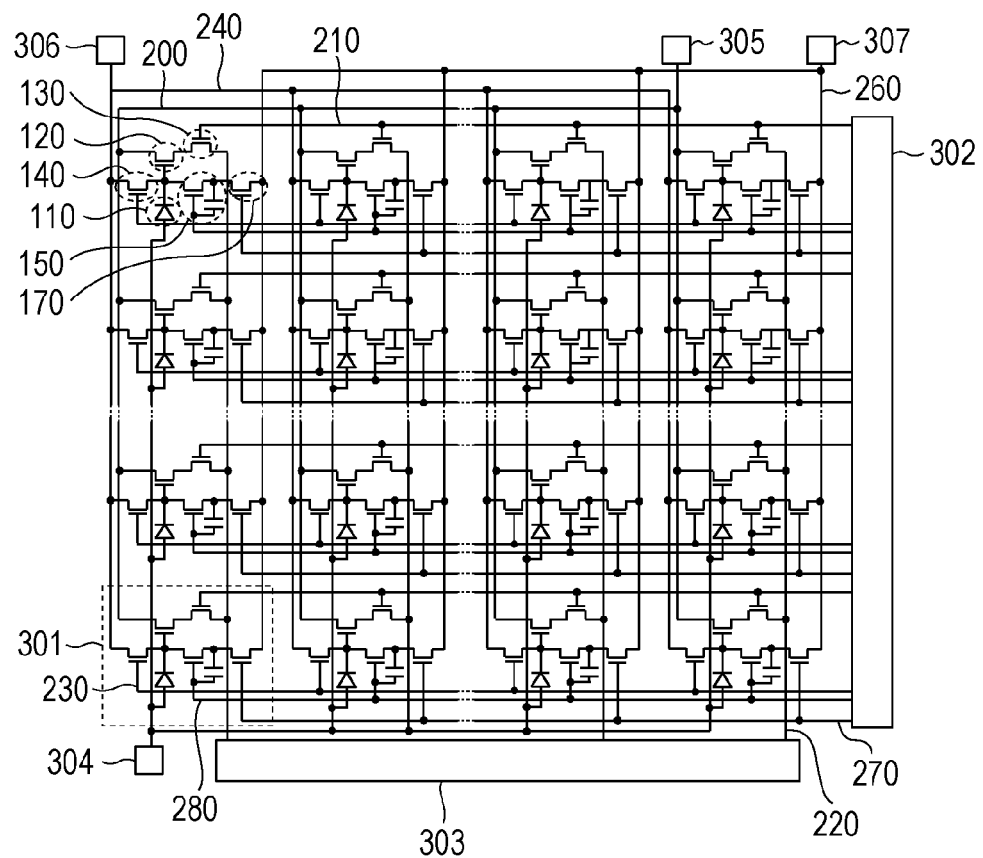
FIG. 4A is an equivalent circuit diagram of a whole detection apparatus according to a second embodiment.
Figure 4B:
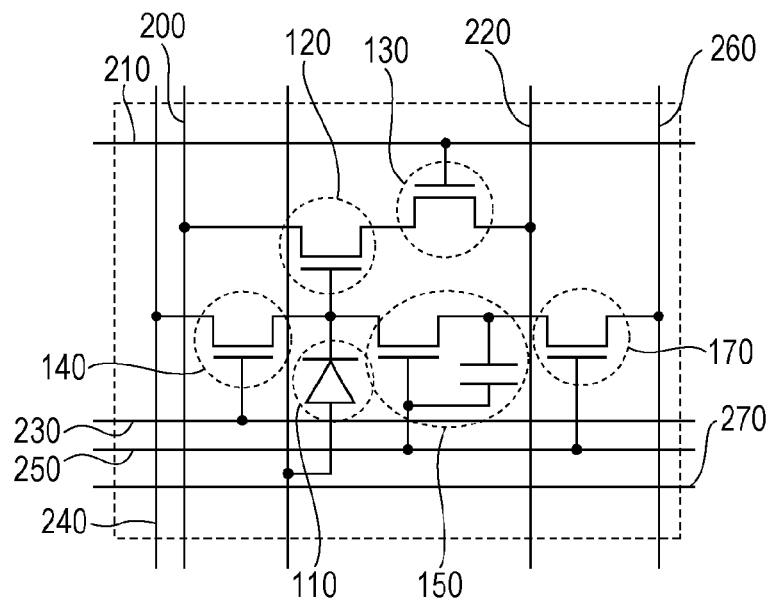
FIG. 4B is an equivalent circuit diagram of one pixel of the detection apparatus.

First, referring to FIGS. 4A and 4B, an equivalent circuit of a detection apparatus according to the present embodiment is described. FIG. 4A shows the equivalent circuit diagram of the detection apparatus according to the present embodiment, and FIG. 4B shows an equivalent circuit of one pixel of the detection apparatus according to the present embodiment.

In the detection apparatus according to the present embodiment, a fifth TFT 170 is added to the pixel structure according to the first embodiment. Note that in FIG. 4A and FIG. 4B, for convenience of illustration, the capacitor 150 is realized by a combination of a TFT and a capacitor connected to this TFT. One of a source and a drain of the fifth TFT 170 is connected to one of electrodes of the capacitor 150, and the other one of the source and the drain of the fifth TFT 170 is connected, via a fixed potential line 260, to a third power supply 307 for supplying a fixed potential. The fixed potential may be, for example, a ground potential or the like. A gate of the fifth TFT 170 is connected to the driving circuit 302 via a switching drive line 270. In the present embodiment, a fixed potential supplying unit is realized by a combination including the fifth TFT 170, the fixed potential line 260, and the third power supply 307.

Figure 5:
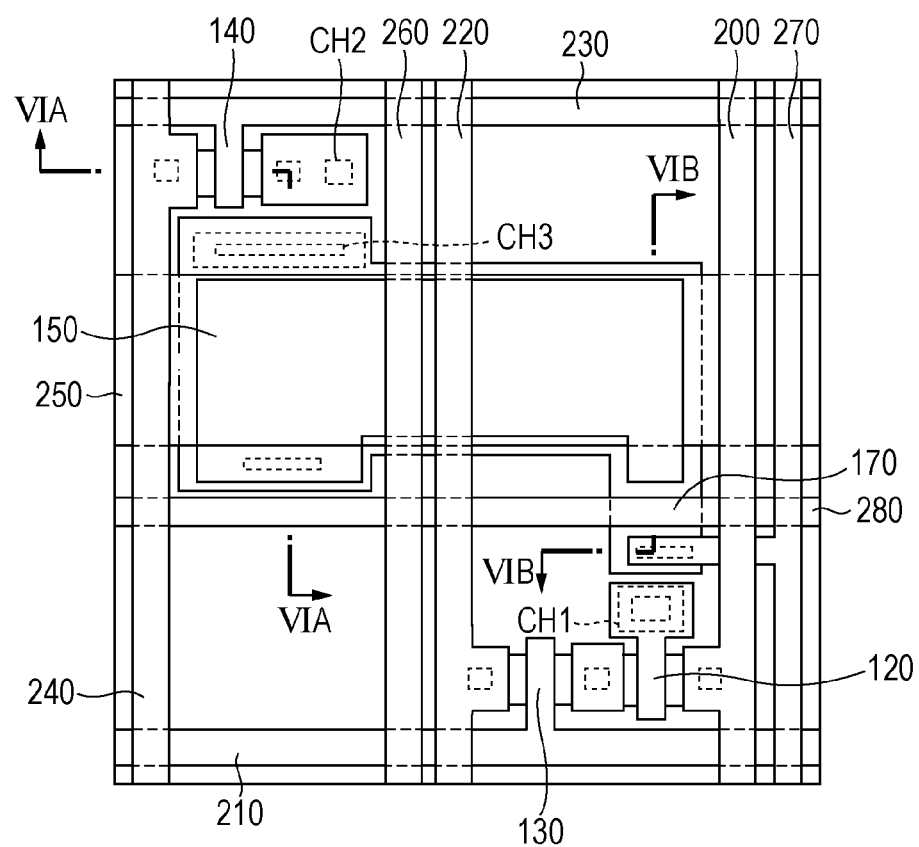
FIG. 5 is a plan view of one pixel of the detection apparatus according to the second embodiment.
Figure 6A:
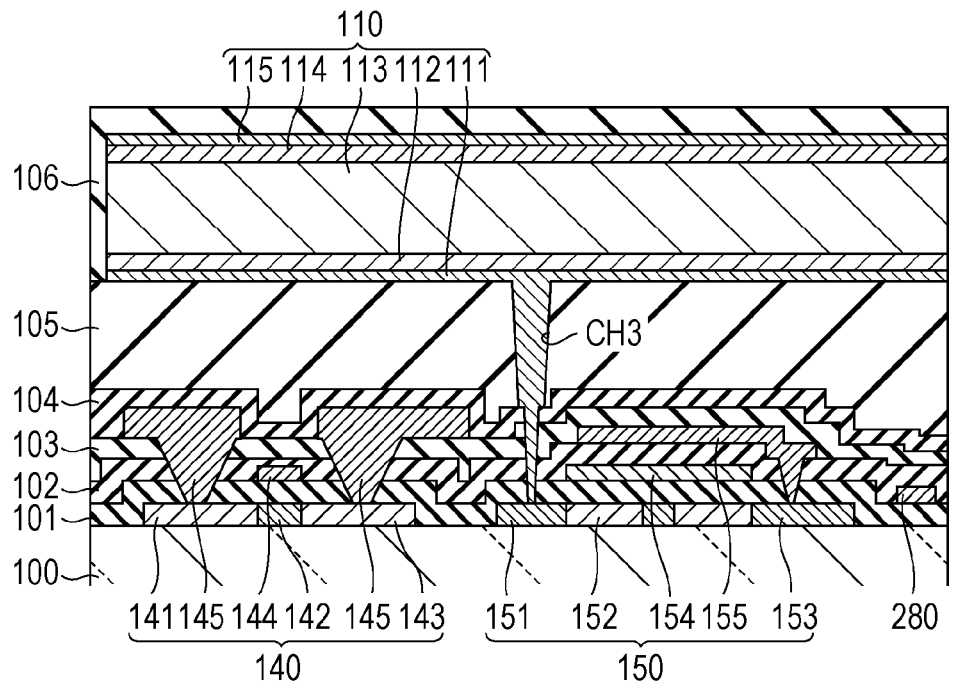
FIG. 6A and FIG. 6B are cross-sectional views of one pixel of the detection apparatus according to the second embodiment.
Figure 6B:
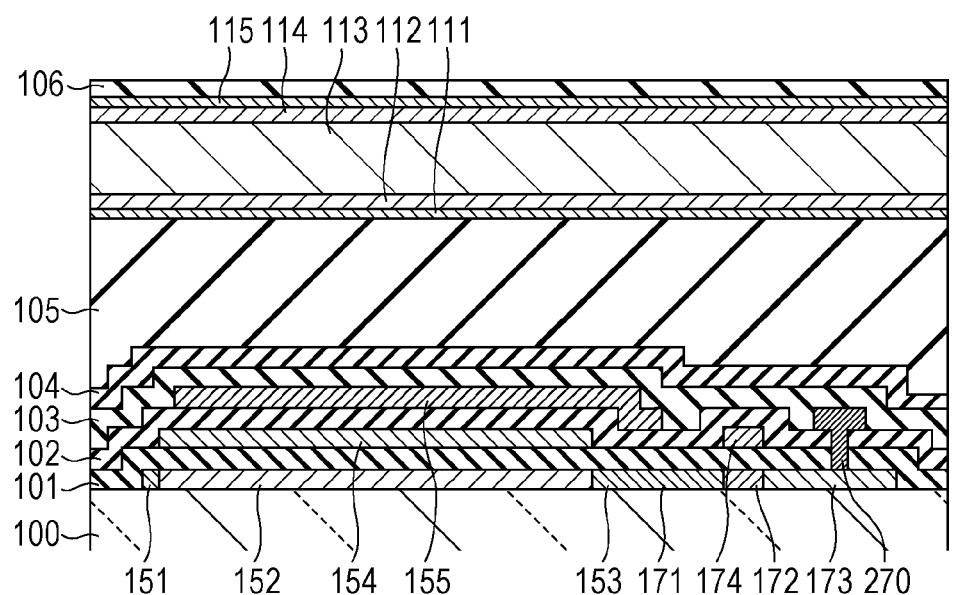

Next, referring to FIG. 5, FIG. 6A, and FIG. 6B, a structure of one pixel according to the second embodiment is described below. FIG. 5 is a plan view of one pixel, FIG. 6A is a cross-sectional view taken along line VIA-VIA of FIG. 6A, and FIG. 6B is a cross-sectional view taken along line VIB-VIB of FIG. 6A.

The capacitor 150 a semiconductor layer functioning as one of electrodes, a first insulating layer 101, a conductive layer 154 functioning as the other one of the electrodes, a second insulating layer 102, and an electrode layer 155, which are disposed vertically in this order as seen from the substrate 100 in an upward direction. The semiconductor layer of the capacitor 150 includes an impurity semiconductor region 151, a semiconductor region 152, and an impurity semiconductor region 153 wherein the impurity semiconductor region 151 is connected to the conversion element 110. The electrode layer 155 is connected to the impurity semiconductor region 153 opposing the impurity semiconductor region 151 via the semiconductor region 152. The impurity semiconductor region 153 functions as another ohmic contact part according to the present embodiment. In the structure described above, when the first electric potential is supplied to the conductive layer 154, capacitance is provided between the conductive layer 154 and electrode layer 155 and is added to the capacitance provided by the semiconductor region 152 and the conductive layer 154 whereby a greater capacitance value is achieved than can be provided by the capacitor 150 according to the first embodiment.

The fifth TFT 170 includes a semiconductor layer, a first insulating layer 101, a gate 174, and a second insulating layer 102, which are disposed vertically in this order as seen from the substrate 100 in the upward direction. The semiconductor layer of the fifth TFT 170 includes a semiconductor region 172, an impurity semiconductor region 171 with a higher impurity concentration than the semiconductor region 172, and an impurity semiconductor region 173 with a higher impurity concentration than the semiconductor region 172. The semiconductor region 172 is formed at a location corresponding to an orthogonal projection of the gate 174. The impurity semiconductor region 171 and the impurity semiconductor region 173 are doped with impurity of the same conductivity type. One of these regions functions as a source and the other as a drain. The impurity semiconductor region 171 and the impurity semiconductor region 153 of the capacitor 150 are formed so as to share the same region which is connected to the electrode layer 155 of the capacitor 150. The gate 174 is electrically connected to the switching drive line 270, and the impurity semiconductor region 173 is connected to the fixed potential line 260.

When the first electric potential is supplied to the conductive layer 154, capacitance is provided between the conductive layer 154 and electrode layer 155 and is added to the capacitance provided by the semiconductor region 152 and the conductive layer 154 of the capacitor 150. On the other hand, when the second electric potential is supplied to the conductive layer 154, no additional capacitance is connected to the conversion element 110. Thus, it becomes possible to adjust the saturation intensity of the pixel. When the second electric potential is supplied to the conductive layer 154, if the electrode layer 155 is in an electrically floating state, capacitive coupling between the electrode layer 155 and the signal line 220 may influence the electric potential of the signal line 220, which may result in noise. On the other hand, if there is capacitive coupling between the electrode layer 155 and the first electrode 111 of the conversion element 110, the electric potential of the first electrode 111 of the conversion element 110 may be influenced, which may result in an artifact. To avoid the above-described problem, when the second electric potential is supplied to the conductive layer 154, the fifth TFT 170 is turned on thereby fixing the electrode layer 155 at the fixed potential such that the electric potential of the signal line 220 and the electric potential of the first electrode 111 are not influenced even if there is capacitive coupling between the electrode layer 155 and the signal line 220 or the first electrode 111 whereby noise or an artifact is suppressed.

Figure 7A:
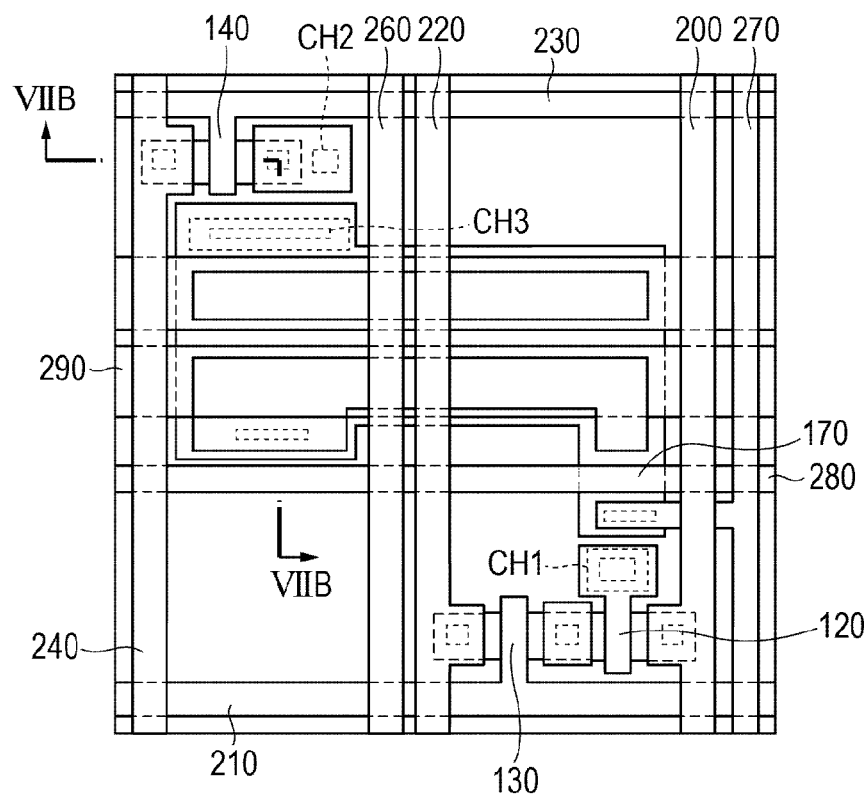
FIG. 7A is a plan view illustrating another example of a structure of one pixel of the detection apparatus according to the second embodiment.
Figure 7B:
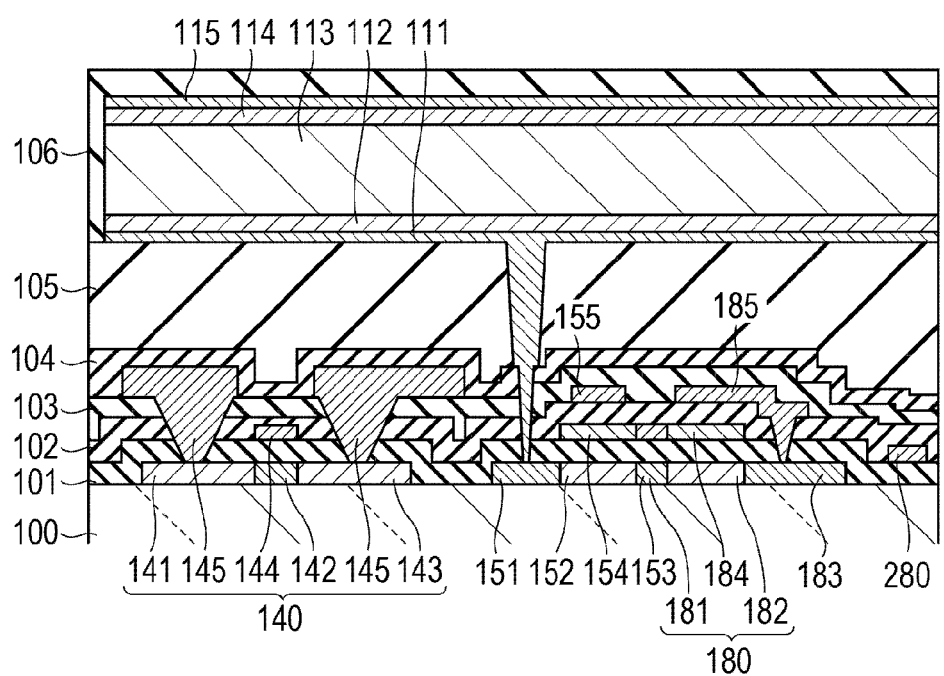
FIG. 7B is a cross-sectional view of the one pixel.

Next, referring to FIG. 7A and FIG. 7B, another example of a pixel structure according to the second embodiment is described. In this example, a plurality of capacitors are disposed in a parallel manner. By employing this configuration, it becomes possible to switch the capacitance of the pixel among three or more levels depending on the image capture condition, and thus it becomes possible to correspondingly switch the maximum allowable radiation intensity among three or more levels. FIG. 7A is a plan view of one pixel, and FIG. 7B is a cross-sectional view taken along line VIIB-VIIB of FIG. 7A. In this example according to the present embodiment, although two capacitors are connected in parallel to the conversion element 110, three or more capacitors may be connected to parallel.

In the detection apparatus according to the present example of the embodiment, the pixel structure further includes, in addition to the pixel structure described above, a second capacitor 180 disposed between the capacitor 150 and the fifth TFT 170. The second capacitor 180 includes a semiconductor layer functioning as one of electrodes, a first insulating layer 101, a conductive layer 184 functioning as the other one of the electrodes, a second insulating layer 102, and an electrode layer 185, which are disposed vertically in this order as seen from the substrate 100 in an upward direction. The semiconductor layer of the second capacitor 180 includes an impurity semiconductor region 181, a semiconductor region 182, and an impurity semiconductor region 183, wherein the impurity semiconductor region 181 and the impurity semiconductor region 153 of the capacitor 150 are formed so as to share the same region. The electrode layer 185 is connected to the impurity semiconductor region 183 opposing the impurity semiconductor region 181 via the semiconductor region 182. In the structure described above, when the first electric potential is supplied to the conductive layer 184, capacitance is provided between the conductive layer 184 and electrode layer 185 and is added to the capacitance provided by the semiconductor region 182 and the conductive layer 184, and the impurity semiconductor region 183 of the second capacitor 180 is connected to the fifth TFT 170.

Thus, by employing the structure described above, it is possible to switch the capacitance of the pixel among three levels. More specifically, for example, to disconnect the conversion element 110 from the capacitors, the second electric potential is supplied to the conductive layer 154 of the capacitor 150, the first electric potential is supplied to the conductive layer 184 of the second capacitor 180, and the fifth TFT 170 is turned on. As a result, the capacitance of the pixel is given by capacitance provided between the first electrode 111 and the second electrode 115 of the conversion element 110. In this state, the fixed potential is supplied to the electrode layer 155 of the capacitor 150 and the electrode layer 185 of the second capacitor 180. On the other hand, to connect only the capacitor 150 to the conversion element 110, the first electric potential is supplied to the conductive layer 154 of the capacitor 150, the second electric potential is supplied to the conductive layer 184 of the second capacitor 180, and the fifth TFT 170 is turned on. Thus, the capacitance the pixel is given by the sum of the capacitance provided between the first electrode 111 and the second electrode 115 of the conversion element 110 and the capacitance provided by the capacitor 150. In this state, the fixed potential is supplied to the electrode layer 185 of the second capacitor 180. In a case where all capacitors are connected to the conversion element 110, the first electric potential is supplied to the conductive layer 154 of the capacitor 150 and the conductive layer 184 of the second capacitor 180, and the fifth TFT 170 is turned off. Thus, the capacitance the pixel is given by the sum of the capacitance provided between the first electrode 111 and the second electrode 115 of the conversion element 110, the capacitance provided by the capacitor 150, and the capacitance provided by the second capacitor 180.

Next, referring to FIG. 8A, FIG. 8B, FIG. 9A, and FIG. 9B, a detection apparatus according to a third embodiment of the invention is described. In the following description, similar elements to those according to the first or second embodiment are denoted by similar reference numerals or symbols, and a further explanation thereof is omitted. In this embodiment, the electrode layer of the capacitor described in the second embodiment is shielded to avoid capacitive coupling to electrically conductive elements. In the following description, two examples according to the present embodiment are shown. In a first example shown in FIG. 8A and FIG. 8B, a signal line is shielded from capacitive coupling to driving lines. In a second example shown in FIG. 9A and FIG. 9B, a signal line is shielded from capacitive coupling to a conversion element. Note that the present embodiment is not limited to those examples, but shielding may be performed between other elements, for example, between a driving line and a conversion element.

Figure 8A:
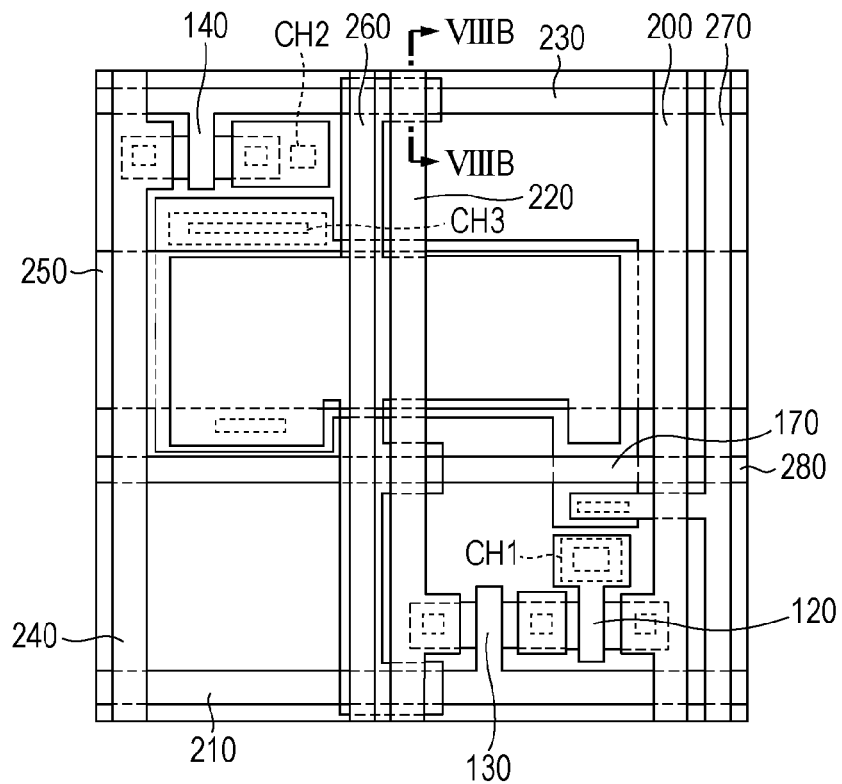
FIG. 8A is a plan view of one pixel of a detection apparatus according to a third embodiment.
Figure 8B:
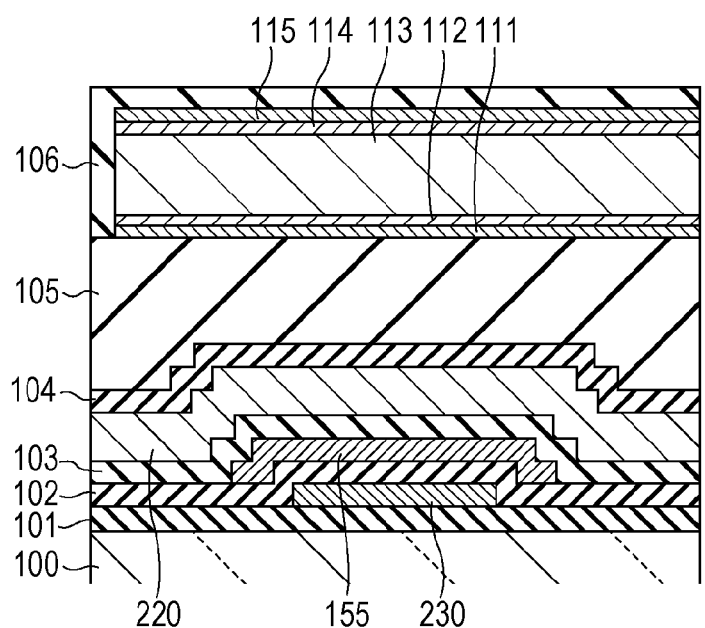
FIG. 8B is a cross-sectional view of the one pixel of the detection apparatus.

First, referring to FIG. 8A and FIG. 8B, a description is given of a structure in which a signal line is shielded from capacitive coupling to driving lines. FIG. 8A is a plan view of one pixel, and FIG. 8B is a cross-sectional view taken along line VIIIB-VIIIB of FIG. 8A.

At an intersection between a selection driving line 210 and a signal line 220, an electrode layer 155 of a capacitor 150 is disposed between the selection driving line 210 and the signal line 220. Furthermore, at an intersection between a reset driving line 230 and the signal line 220, the electrode layer 155 of the capacitor 150 is disposed between the reset driving line 230 and the signal line 220. By employing this configuration, it becomes possible to prevent the signal line 220 from being capacitively coupled with the driving line as long as the fixed potential is supplied to the electrode layer 155. Therefore, it becomes possible to suppress a fluctuation in electric potential of the signal line 220 due to a pulse signal of turn-on voltage or turn-off voltage on driving lines, which makes it possible to prevent noise due to the fluctuation in electric potential from being superimposed on an output signal. By forming the electrode layer 155 only in intersection areas, it becomes possible to achieve shielding without causing an unnecessary increase in capacitance of the signal line 220. Thus it becomes possible to suppress an increase in noise due to an increase in capacitance of the signal line 220.

Figure 9A:
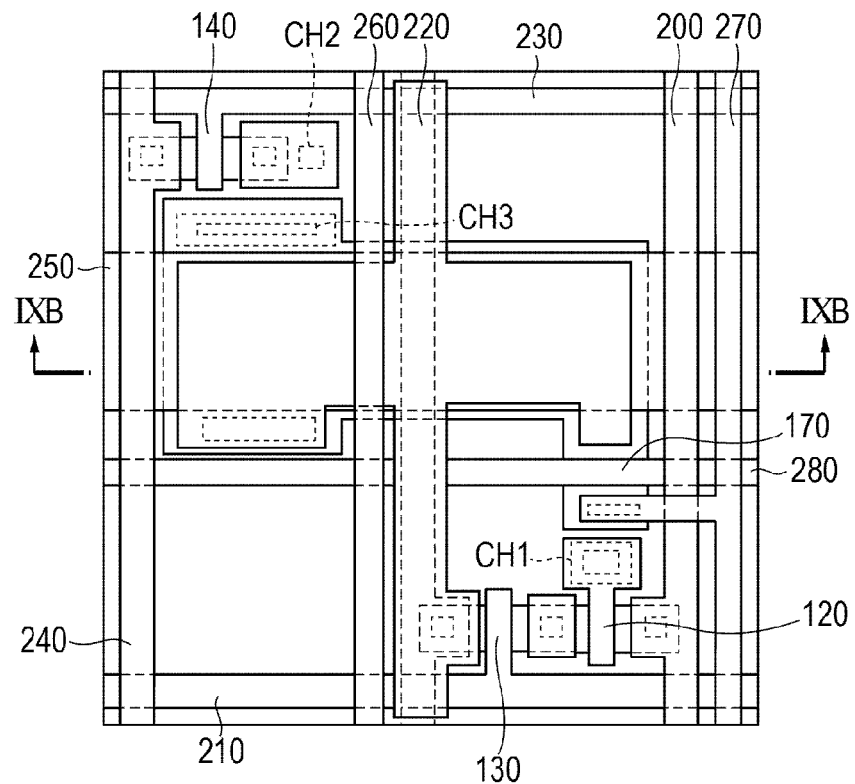
FIG. 9A is a plan view illustrating another example of a structure of one pixel of the detection apparatus according to the third embodiment.
Figure 9B:
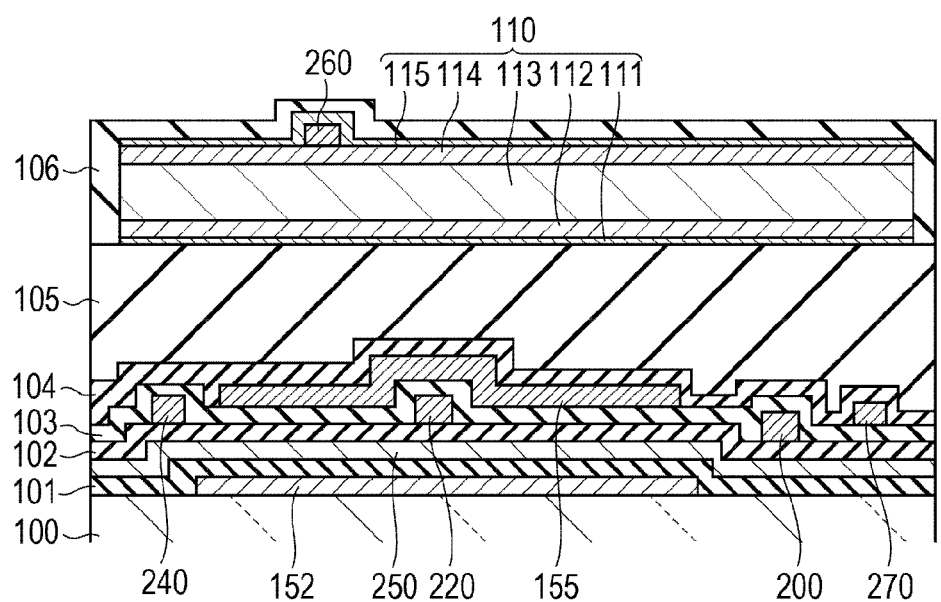
FIG. 9B is a cross-sectional view of the one pixel.

Next, referring to FIG. 9A and FIG. 9B, a description is given of a structure in which a signal line is shielded from capacitive coupling to a first electrode 111 of a conversion element 110. FIG. 9A is a plan view of one pixel, and FIG. 9B is a cross-sectional view taken along line VIVB-VIVB of FIG. 9A.

As shown in FIG. 9A and FIG. 9B, an electrode layer 155 of a capacitor 150 is disposed between the signal line 220 and the first electrode 111. At an intersection between the reset driving line 230 and the signal line 220, the electrode layer 155 of the capacitor 150 is disposed between the reset driving line 230 and the signal line 220. This structure makes it possible to prevent capacitive coupling between the signal line 220 and the first electrode 111 of the conversion element 110 as long as the fixed potential is supplied to the electrode layer 155. Thus, it becomes possible to suppress a fluctuation in electric potential of the signal line 220 due to a change in electric potential of the first electrode 111, which makes it possible to prevent noise due to the fluctuation in electric potential from being superimposed on an output signal.

Figure 10:
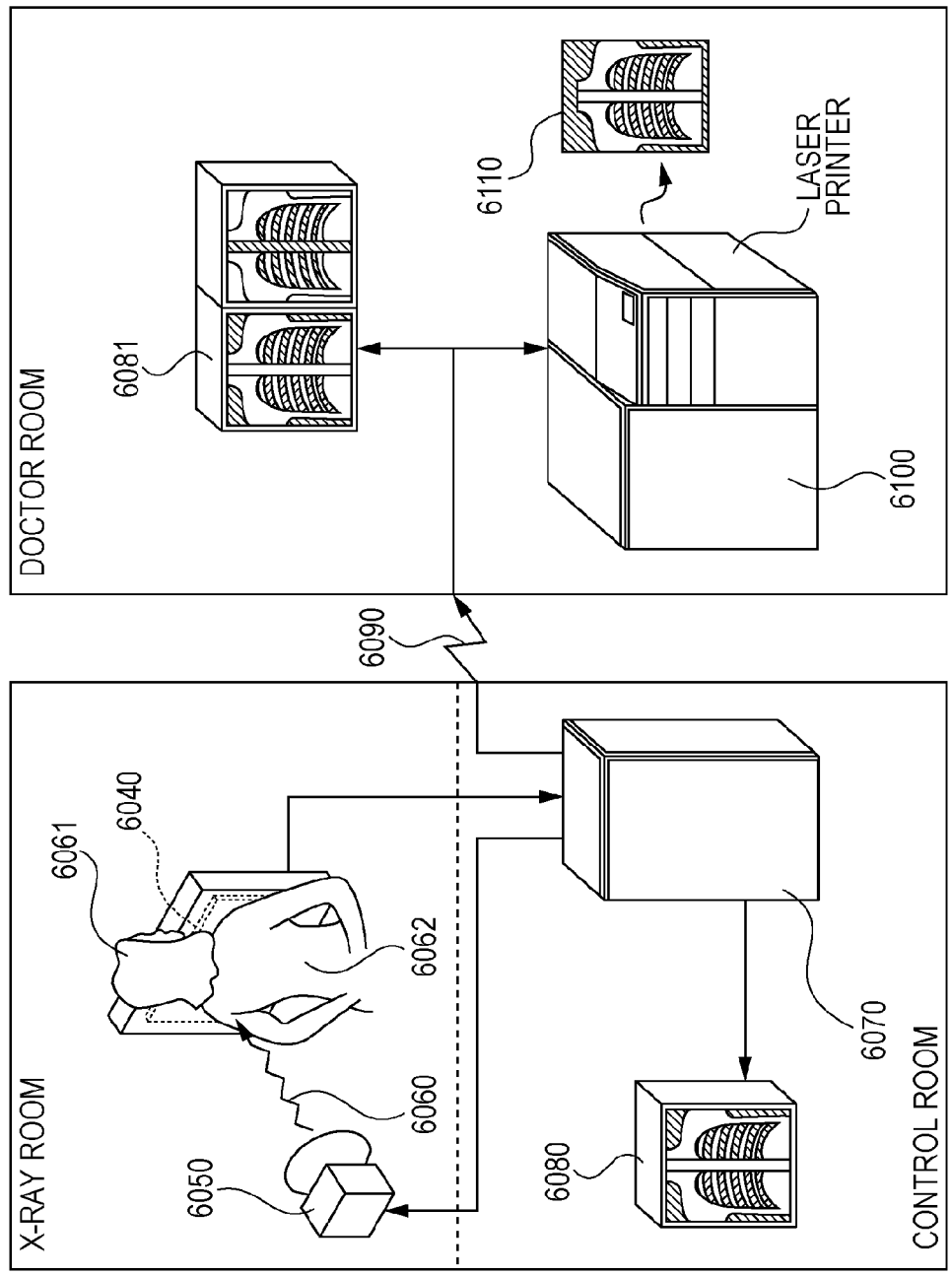
FIG. 10 is a diagram illustrating an example of an X-ray detection system using a detection apparatus.

Next, referring to FIG. 10, a radiation detection system equipped with a detection apparatus according to any of the above-disclosed exemplary embodiments is described below.

An X-ray 6060 generated by an X-ray tube 6050 functioning as a radiation source passes through a body part 6062 of a patient (subject) 6061 under examination and is incident on a radiation detection apparatus 6040 having a scintillator 4 disposed on a first surface of the photoelectric conversion unit 3. The incident X-ray includes information on the inside of the body of the patient 6061. In response to the incident X-ray, the scintillator 4 emits light. The emitted light is converted into electric information by the photoelectric conversion element. The electric information is converted into a digital signal and is subjected to image processing by an image processor 6070 serving as a signal processing unit. A resultant image is displayed on a display 6080 serving as a display unit installed in a control room.

The obtained information may be transferred to a remote location by a transmitting unit via a transmission network 6090, such as a telephone line or the like. The information may be displayed on a display 6081 serving as a display unit installed in a doctor room at the remote location or it may be stored in a storage medium such as an optical disk. This allows a doctor at the remote location to make a diagnosis. The information may be recorded on a film 6110 serving as a recording medium by a film processor 6100 serving as a recording unit.

While the exemplary embodiments have been described with enough detail to enable a person having ordinary skill in the art to practice any of the appended claims, it is to be understood that the disclosed exemplary embodiments are not limiting. The scope of the following claims is to be accorded the broadest interpretation so as to encompass all modifications and equivalent structures and functions.

This application claims the benefit of Japanese Patent Application No. 2011-230908 filed Oct. 20, 2011, which is hereby incorporated by reference herein in its entirety.

What is claimed is:

1. A detection apparatus comprising:
a transistor disposed on a substrate;
a conversion element disposed on the transistor and connected to the transistor;
a capacitor connected in parallel with the conversion element to the transistor, the capacitor including, between the substrate and the conversion element, a first ohmic contact part connected to the conversion element, a semiconductor part connected to the first ohmic contact part, and an electrically conductive part disposed at a location opposite to the semiconductor part and the first ohmic contact part via an insulating layer; and
a potential supplying unit configured to selectively supply a first electric potential to the electrically conductive part to accumulate charge carriers in the semiconductor part and a second electric potential to the electrically conductive part to deplete the semiconductor part,
wherein the capacitor further includes an electrode layer disposed so as to oppose the electrically conductive part, and
wherein the electrode layer is connected to a second ohmic contact part disposed so as to oppose the first ohmic contact part via the semiconductor part.

2. The detection apparatus according to claim 1, wherein:
a semiconductor layer including the semiconductor part of the capacitor is formed in a common processing step in which a semiconductor layer of the transistor is formed; and
the electrically conductive part is formed in a common processing step in which the gate of the transistor is formed.

3. The detection apparatus according to claim 1, further comprising a fixed potential supplying unit configured to supply a fixed potential to the electrode layer.

4. The detection apparatus according to claim 3, further comprising:
a driving line connected to a gate of the transistor; and
a signal line connected to one of a source and a drain of the transistor, wherein
the driving line and the signal line are disposed between the substrate and the conversion element.

5. The detection apparatus according to claim 4, wherein the electrode layer is disposed between the electrically conductive part and the conversion element.

6. The detection apparatus according to claim 5, wherein the electrode layer is disposed between the signal line and the conversion element.

7. The detection apparatus according to claim 5, wherein:
the transistor is configured such that the semiconductor layer, the electrically conductive part, and the electrode layer are disposed upon each other as seen from the substrate in an upward direction; and
the electrode layer is configured such that in an intersection area where the driving line intersects the signal line via an insulating layer, the electrode layer is located between the driving line and the signal line.

8. The detection apparatus according to claim 1, wherein the semiconductor part and a semiconductor layer including the semiconductor part of the capacitor are made of a polycrystalline semiconductor.

9. The detection apparatus according to claim 1, wherein there are a plurality of pixels each including a conversion element and a capacitor, wherein each pixel further includes a first thin-film transistor having a gate connected to the conversion element, a second thin-film transistor for selecting the pixel, and a third thin-film transistor for resetting the gate of the first thin-film transistor, and wherein
the transistor is one of the first thin-film transistor, the second thin-film transistor, and the third thin-film transistor.

10. A detection system comprising:
the detection apparatus according to claim 1;
a signal processing unit configured to process a signal supplied from the detection apparatus;
a storage unit configured to store a signal from the signal processing unit;
a display unit configured to display the signal from the signal processing unit; and
a transmitting unit configured to transmit the signal supplied from the signal processing unit.

11. A detection apparatus comprising:
a transistor disposed on a substrate;
a conversion element disposed on the transistor and connected to the transistor;
a capacitor connected in parallel with the conversion element to the transistor, wherein the capacitor includes, between the substrate and the conversion element, a semiconductor layer connected to the conversion element, and an electrically conductive part disposed at a location opposite to the semiconductor layer via an insulating layer, and wherein the semiconductor layer includes a semiconductor part located in a region corresponding to an orthogonal projection of the conductive layer, and an ohmic contact part located outside of the region for providing an ohmic connection between the conversion element and the semiconductor part; and
a potential supplying unit configured to selectively supply a first electric potential to the electrically conductive part to accumulate charge carriers in the semiconductor part and a second electric potential to the electrically conductive part to deplete the semiconductor part.

12. The detection apparatus according to claim 11, wherein:
the semiconductor layer including the semiconductor part of the capacitor is formed in a common processing step in which a semiconductor layer of the transistor is formed, and
the electrically conductive part is formed in a common processing step in which the gate of the transistor is formed.

13. The detection apparatus according to claim 11, wherein the capacitor further includes an electrode layer disposed so as to oppose the electrically conductive part, and wherein the electrode layer is connected to another ohmic contact part disposed so as to oppose the ohmic contact part via the semiconductor part.

14. The detection apparatus according to claim 13, further comprising a fixed potential supplying unit configured to supply a fixed potential to the electrode layer.

15. The detection apparatus according to claim 14, further comprising:
a driving line connected to a gate of the transistor; and
a signal line connected to one of a source and a drain of the transistor, wherein the driving line and the signal line are disposed between the substrate and the conversion element.

16. The detection apparatus according to claim 15, wherein the electrode layer is disposed between the electrically conductive part and the conversion element.

17. The detection apparatus according to claim 16, wherein the electrode layer is disposed between the signal line and the conversion element.

18. The detection apparatus according to claim 16, wherein:
the transistor is configured such that the semiconductor layer, the electrically conductive part, and the electrode layer are disposed upon each other as seen from the substrate in an upward direction, and
the electrode layer is configured such that in an intersection area where the driving line intersects the signal line via an insulating layer, the electrode layer is located between the driving line and the signal line.

19. The detection apparatus according to claim 11, wherein the semiconductor part and a semiconductor layer of the transistor are made of a polycrystalline semiconductor.

20. The detection apparatus according to claim 11, wherein there are a plurality of pixels each including a conversion element and a capacitor,
wherein each pixel further includes a first thin-film transistor having a gate connected to the conversion element, a second thin-film transistor for selecting the pixel, and a third thin-film transistor for resetting the gate of the first thin-film transistor, and
wherein the transistor is one of the first thin-film transistor, the second thin-film transistor, and the third thin-film transistor.

21. A detection system comprising:
a detection apparatus comprising:
a transistor disposed on a substrate;
a conversion element disposed on the transistor and connected to the transistor;
a capacitor connected in parallel with the conversion element to the transistor, wherein the capacitor includes, between the substrate and the conversion element, a semiconductor layer connected to the conversion element, and an electrically conductive part disposed at a location opposite to the semiconductor layer via an insulating layer, and wherein the semiconductor layer includes a semiconductor part located in a region corresponding to an orthogonal projection of the conductive layer, and an ohmic contact part located outside of the region for providing an ohmic connection between the conversion element and the semiconductor part; and
a potential supplying unit configured to selectively supply a first electric potential to the electrically conductive part to accumulate charge carriers in the semiconductor part and a second electric potential to the electrically conductive part to deplete the semiconductor part;
a signal processing unit configured to process a signal supplied from the detection apparatus;
a storage unit configured to store a signal from the signal processing unit;
a display unit configured to display the signal from the signal processing unit; and
a transmitting unit configured to transmit the signal supplied from the signal processing unit.

22. A detection apparatus comprising:
a transistor disposed on a substrate;
a conversion element disposed above the transistor and connected to the transistor;
a capacitor connected to the conversion element to add a capacitance value to the conversion element,
wherein the capacitor includes, between the substrate and the conversion element, a semiconductor layer connected to the conversion element, and an electrically conductive part disposed at a location opposite to the semiconductor layer via an insulating layer, and
wherein the semiconductor layer includes a semiconductor part located in a region corresponding to an orthogonal projection of the conductive layer, and an ohmic contact part located outside of the region for providing an ohmic connection between the conversion element and the semiconductor part; and
a potential supplying unit configured to supply a first electric potential to the electrically conductive part for adding the capacitance value of the capacitor to the conversion element and a second electric potential to the electrically conductive part for not adding the capacitance value of the capacitor to the conversion element.

23. A detection system comprising:
a detection apparatus comprising:
a transistor disposed on a substrate;
a conversion element disposed above the transistor and connected to the transistor;
a capacitor connected to the conversion element to add a capacitance value to the conversion element, wherein the capacitor includes, between the substrate and the conversion element, a semiconductor layer connected to the conversion element, and an electrically conductive part disposed at a location opposite to the semiconductor layer via an insulating layer, and wherein the semiconductor layer includes a semiconductor part located in a region corresponding to an orthogonal projection of the conductive layer, and an ohmic contact part located outside of the region for providing an ohmic connection between the conversion element and the semiconductor part; and
a potential supplying unit configured to supply a first electric potential to the electrically conductive part for adding the capacitance value of the capacitor to the conversion element and a second electric potential to the electrically conductive part for not adding the capacitance value of the capacitor to the conversion element;
a signal processing unit configured to process a signal supplied from the detection apparatus;
a storage unit configured to store a signal from the signal processing unit;
a display unit configured to display the signal from the signal processing unit; and
a transmitting unit configured to transmit the signal supplied from the signal processing unit.

* * * * *